US012640066B2

(12) United States Patent
Yang

(10) Patent No.: US 12,640,066 B2
(45) Date of Patent: May 26, 2026

(54) DISPLAY PANEL REPAIR DEVICE AND DISPLAY PANEL REPAIR METHOD

(71) Applicant: Century Technology (Shenzhen) Corporation Limited, Shenzhen (CN)

(72) Inventor: Shao-Fu Yang, New Taipei (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 246 days.

(21) Appl. No.: 18/378,253

(22) Filed: Oct. 10, 2023

(65) Prior Publication Data

US 2024/0144847 A1 May 2, 2024

(30) Foreign Application Priority Data

Oct. 31, 2022 (CN) .......................... 202211351544.3

(51) Int. Cl.
*G09G 3/00* (2006.01)
*H01L 25/075* (2006.01)
*H10W 90/00* (2026.01)

(52) U.S. Cl.
CPC ............ *G09G 3/006* (2013.01); *H10W 90/00* (2026.01); *G09G 2330/08* (2013.01); *G09G 2330/12* (2013.01)

(58) Field of Classification Search
CPC ............... G09G 3/006; G09G 2330/08; G09G 2330/12; H01L 25/0753; H01L 21/67144; H01L 21/67259; H10H 20/01; G01R 31/2635; G02F 1/1309
See application file for complete search history.

(56) References Cited

U.S. PATENT DOCUMENTS

| | | | | |
|---|---|---|---|---|
| 8,791,474 B1 * | 7/2014 | Bibl | ...................... | G09G 3/2003 |
| | | | | 257/89 |
| 2019/0079362 A1 * | 3/2019 | He | .......................... | G02F 1/1309 |
| 2021/0005796 A1 * | 1/2021 | Min | ...................... | H10H 20/854 |

FOREIGN PATENT DOCUMENTS

| | | | | |
|---|---|---|---|---|
| CN | 110323244 A | * | 10/2019 | ............. H01L 22/20 |
| CN | 114093802 A | * | 2/2022 | ........... H10H 20/857 |

OTHER PUBLICATIONS

English translation of CN 110323244 A (Year: 2019).*
English translation of CN 114093802 A (Year: 2022).*

* cited by examiner

*Primary Examiner* — Huy Q Phan
*Assistant Examiner* — Haidong Zhang
(74) *Attorney, Agent, or Firm* — ScienBiziP, P.C.

(57) ABSTRACT

A display panel repair device includes a supporting part, a picking part, and a debonding part. The supporting part is configured to carry a display panel and control a movement of the display panel. The display panel includes a display substrate and a plurality of light-emitting diodes (LEDs) fixing on the display substrate by binding material. The picking part is located on a side of the supporting part used to carry the display panel and configured for removing a LED from the display substrate and placing a new LED on the display substrate. The debonding part is configured to heat the display substrate from a side of the display substrate away from the picking part to melt the binding material.

12 Claims, 7 Drawing Sheets

100

100

200

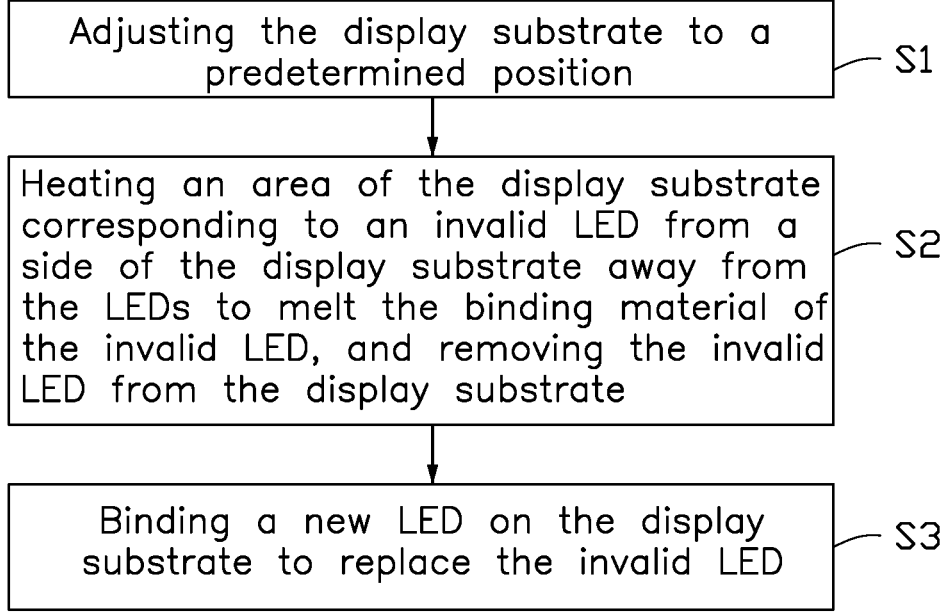

Adjusting the display substrate to a predetermined position — S1

Heating an area of the display substrate corresponding to an invalid LED from a side of the display substrate away from the LEDs to melt the binding material of the invalid LED, and removing the invalid LED from the display substrate — S2

Binding a new LED on the display substrate to replace the invalid LED — S3

FIG. 7

DISPLAY PANEL REPAIR DEVICE AND DISPLAY PANEL REPAIR METHOD

FIELD

The subject matter herein relates to a field of display technology, particularly relates to a display panel repair device and a display panel repair method.

BACKGROUND

With the development of display technology, Micro light-emitting diodes (Micro LEDs) have attracted more and more attention due to their high brightness, better luminous efficiency, and lower power consumption. However, the micro LED has a small size of less than 200 μm. When the Micro LEDs are mounted on the display substrate, how to repair unqualified Micro LEDs has become an urgent problem to be solved.

Therefore, there is room for improvement in the art.

BRIEF DESCRIPTION OF THE DRAWINGS

Implementations of the present technology will now be described, by way of embodiments only, with reference to the attached figures.

FIG. 7 is a flowchart of the display panel repair method according to an embodiment of the present disclosure.

DETAILED DESCRIPTION

Figure 1:
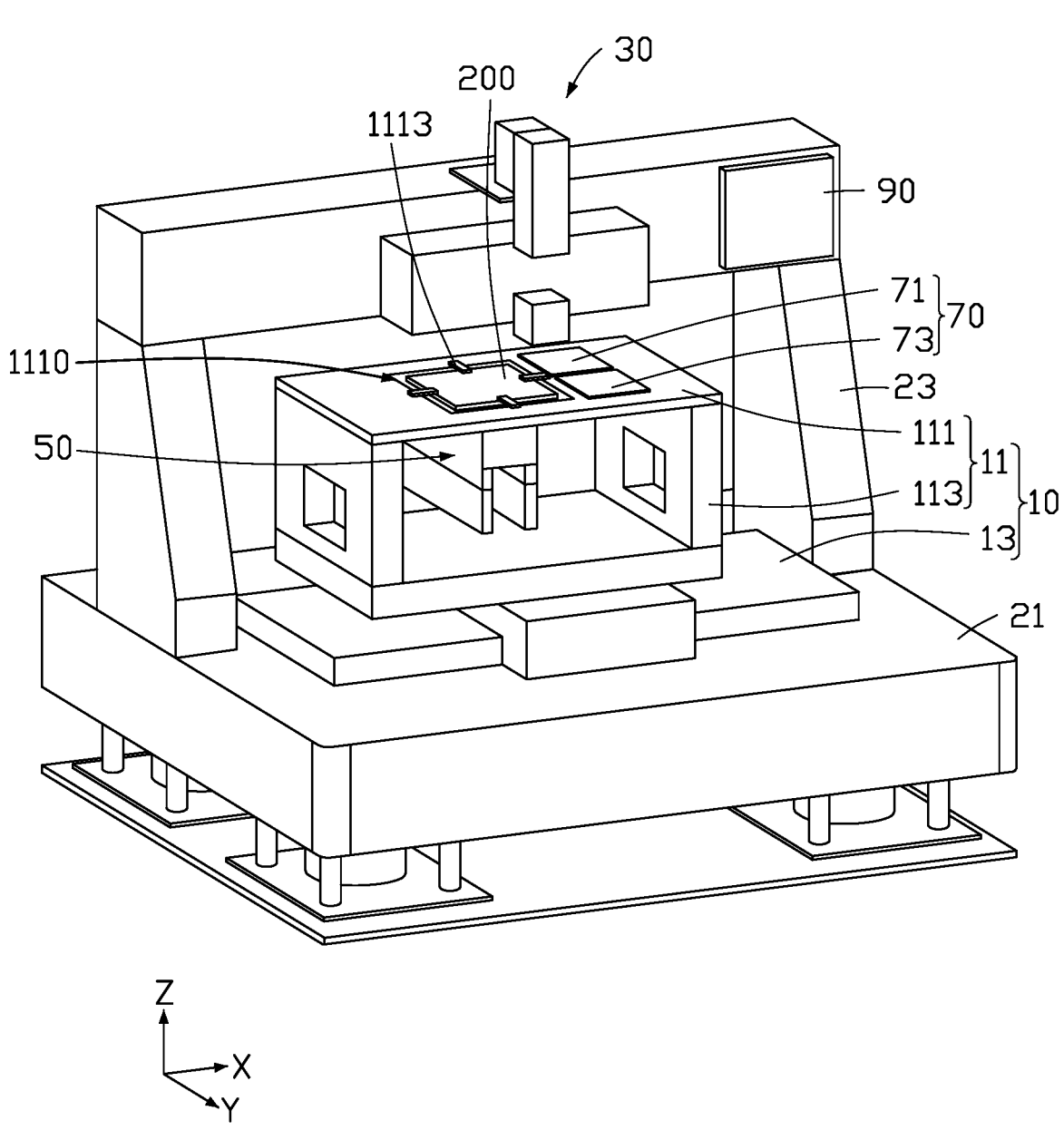
FIG. 1 is an isometric view of a display panel repair device according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to;" it specifically indicates open-ended inclusion or membership in the so-described combination, group, series, and the like.

Figure 2:
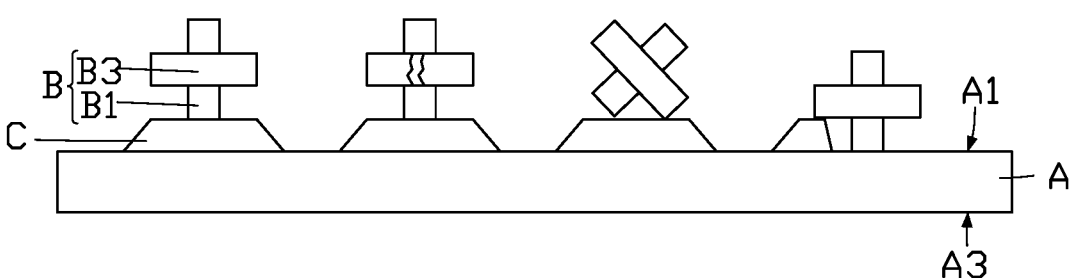
FIG. 2 is a schematic view of a display substrate according to an embodiment of the present disclosure.

FIG. 1 illustrates a display panel repair device 100. The display panel repair device 100 includes a supporting part 10, a picking part 30, and a debonding part 50. The supporting part 10 is used to carry a display panel 200 and control a movement of the display panel 200. As shown in FIG. 2, the display panel 200 includes a display substrate A and a plurality of LEDs B on the display substrate A. Each LED B is fixed to the display substrate A by binding material C. The picking part 30 is arranged on a side of the supporting part 10 carrying the display panel 200. The picking part 30 is located above the supporting part 10 and configured for removing the light emitting diodes (LEDs) B from the display substrate A and placing the LEDs B on the display substrate A. The debonding part 50 is used to heat the display substrate A from a side of the display substrate A away from the picking part 30 to melt the binding material C.

In this embodiment, the display panel 200 can be applied to a backlight board of the display device, and image display can be achieved by combing a liquid crystal layer. The display panel 200 can also be applied to self-emitting displays, achieving image display by directly controlling color and intensity of light emitted by the LEDs B. The present disclosure does not limit specific application scenarios of the display panel 200.

As shown in FIG. 2, the display substrate A is an array substrate used to carry the LEDs B. A first surface A1 of the display substrate A is provided with circuit wiring (not shown). At least one electrode B1 of each LED B is connected to the circuit wiring on the display substrate A by conductive binding material C, thereby supplying power to the LEDs B.

In this embodiment, the display substrate A is a transparent substrate, so that the LEDs B on the first surface A1 can be observed from a side of a second surface A3 opposite to the first surface A1. In other embodiments, the display substrate A can also be an opaque substrate, where a mark is on the second surface A3 corresponding to a position of each LED B, so that the position of each LED B on the first surface A1 can also be determined from a direction of the second surface A3.

In this embodiment, each LED B is a micro LED having a size less than 200 μm. A large number of LEDs B are transferred in bulk onto the display substrate A by a massive transfer method. Due to a small size of the LED B, the LED B may not be able to emit light normally after being transferred to display substrate A. For example, the reasons why the LED B cannot emit light normally include: damage to the LED B; misalignment of the LED B when transferring the LED B to display substrate A; too little binding material C filled on the display substrate A, which cannot be electrically connected to the electrode B1 of the LED B. Therefore, it is necessary to remove the invalid the LED B that cannot emit light normally from the display substrate A by the display panel repair device 100 and replace it with the LED B that can emit light normally. In other embodiments, the display panel repair device 100 can also be applied to display panels equipped with other sizes or other models of LEDs, such as mini LEDs.

In this embodiment, the LED B is a vertical LED. Specifically, the LED B includes a light emitting portion B3 and two electrodes B1 on opposite sides of the light emitting portion B3. One electrode B1 of the LED B is electrically connected to the display substrate A by the binding material C. By setting a circuit wiring on a side of the LED B away from the display substrate A, the other electrode B1 can be energized. By applying different voltages to the two electrodes B1, the light emitting portion B3 can emit light.

In other embodiments, the LED B can also be an inverted LED, both the two electrodes B1 of LED B are electrically connected to display substrate A by the binding material C. The present disclosure does not limit a structure of LED B, as long as at least one electrode B1 of LED B is electrically connected to the display substrate A by the binding material C.

As shown in FIG. 1, the supporting part 10 includes a bearing module 11 and a driving module 13. The bearing module 11 is used to fix the display substrate A, so that both the first surface A1 and the second surface A3 of the display substrate A are exposed from the bearing module 11. Specifically, the bearing module 11 includes a bearing platform 111 defining an opening 1110, the opening 1110 is used for accommodating the display substrate A, thereby exposing both the first surface A1 and the second surface A3 of the display substrate A from the bearing platform 111. A size of opening 1110 is greater than or equal to a size of the display substrate A.

The display substrate A can be fixed to the bearing platform 111 by at least one buckle. In this embodiment, the display substrate A can be fixed in the opening 1110 by a plurality of buckles 1113. Each buckle 1113 has two ends, one end of each buckle 1113 fixes to the display substrate A and the other end of each buckle 1113 fixes to the bearing platform 111.

The bearing module 11 also includes a bearing frame 113, which supports the bearing platform 111 and is connected to the driving module 13. The debonding part 50 and the bearing frame 113 are arranged on a same side of the bearing platform 111. The debonding part 50 is configured for aligning with the second surface A3 of the display substrate A. That is, both the bearing frame 113 and the debonding part 50 are located between the bearing platform 111 and the driving module 13.

The bearing frame 113 and the bearing platform 111 can be formed as a whole or as two independent structures, and the present disclosure does not limit this.

As shown in FIG. 1, the driving module 13 is used to drive the display substrate A to move. Specifically, the driving module 13 includes two motors (not shown) that can drive the bearing module 11 to move in a first direction X and a second direction Y. The driving module 13 may include a linear motor driven in the first direction X and a linear motor driven in the second direction Y. Or the driving module 13 may also be a planar motor or other motor that can move in the first direction X and the second direction Y. The present disclosure does not limit this.

Figure 3:
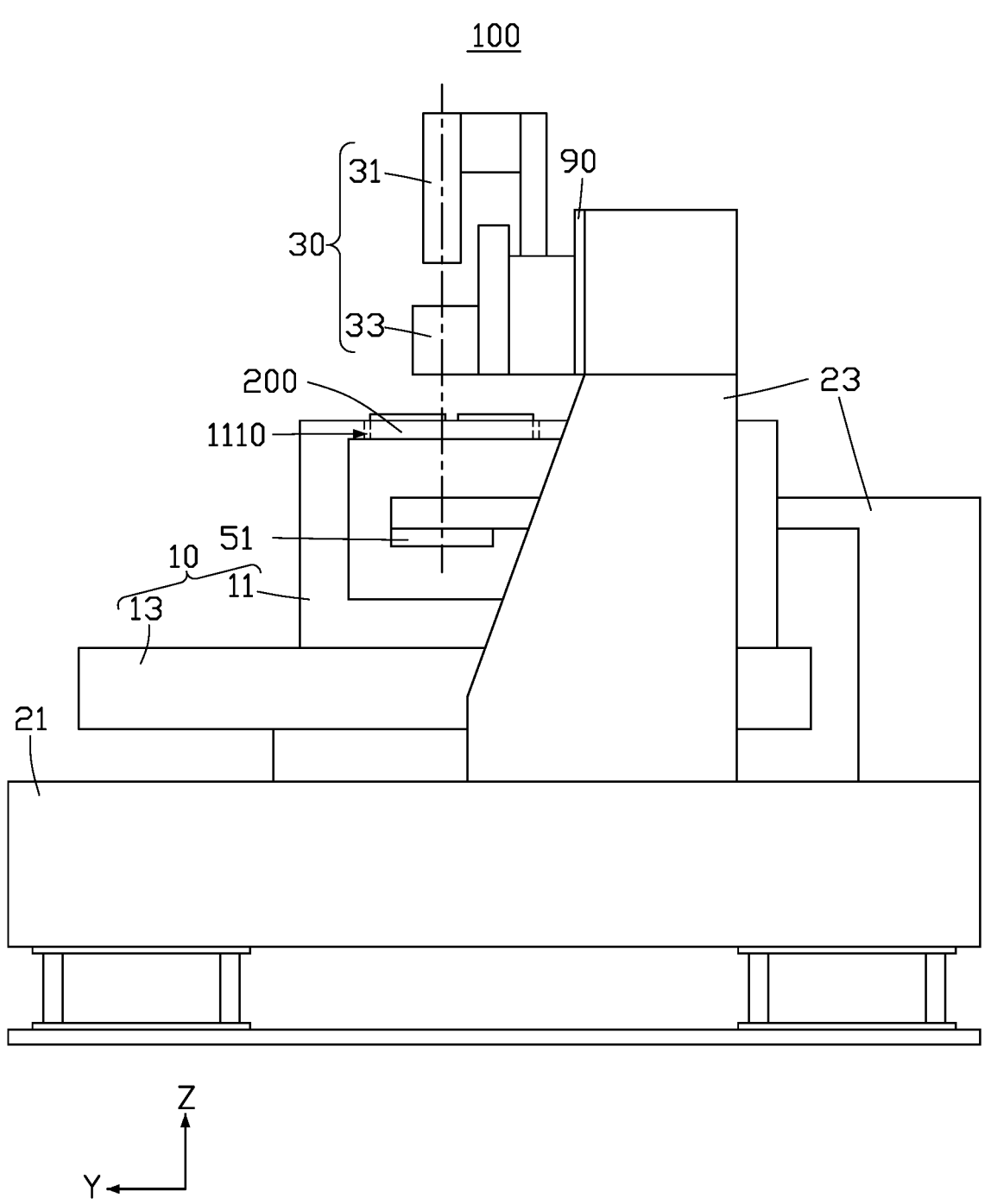
FIG. 3 is a side view of the display panel repair device.

As shown in FIG. 1 and FIG. 3, the display panel repair device 100 also includes a base 21 and a bracket 23. Both the bracket 23 and the supporting part 10 are installed on the base 21, and both the picking part 30 and the debonding part 50 are installed on the bracket 23. The bracket 23 is fixedly connected to the base 21, so the picking part 30 and the debonding part 50 are stationary relative to the base 21. The driving module 13 is arranged on the base 21, and the bearing module 11 is arranged on a side of the driving module 13 away from the base 21. Therefore, the bearing module 11 can move relative to the base 21 under the driving of the driving module 13. The display substrate A fixed on the bearing module 11 follows the movement of the bearing module 11. That is, the display substrate A can move relative to the picking part 30 and the debonding part 50 under the driving of the driving module 13.

The base 21 is a shockproof base and a shockproof structure is set on a side of the base 21 away from the supporting part 10 to ensure that a relative position between the display substrate A and the picking part 30 and a relative position between the display substrate A and the debonding part 50 is not affected by external forces. Specifically, since the size of the LED B on the display substrate A is at a micrometer level, it is necessary to set up a shockproof structure to avoid external force interference on the display panel repair device 100.

Figure 5:
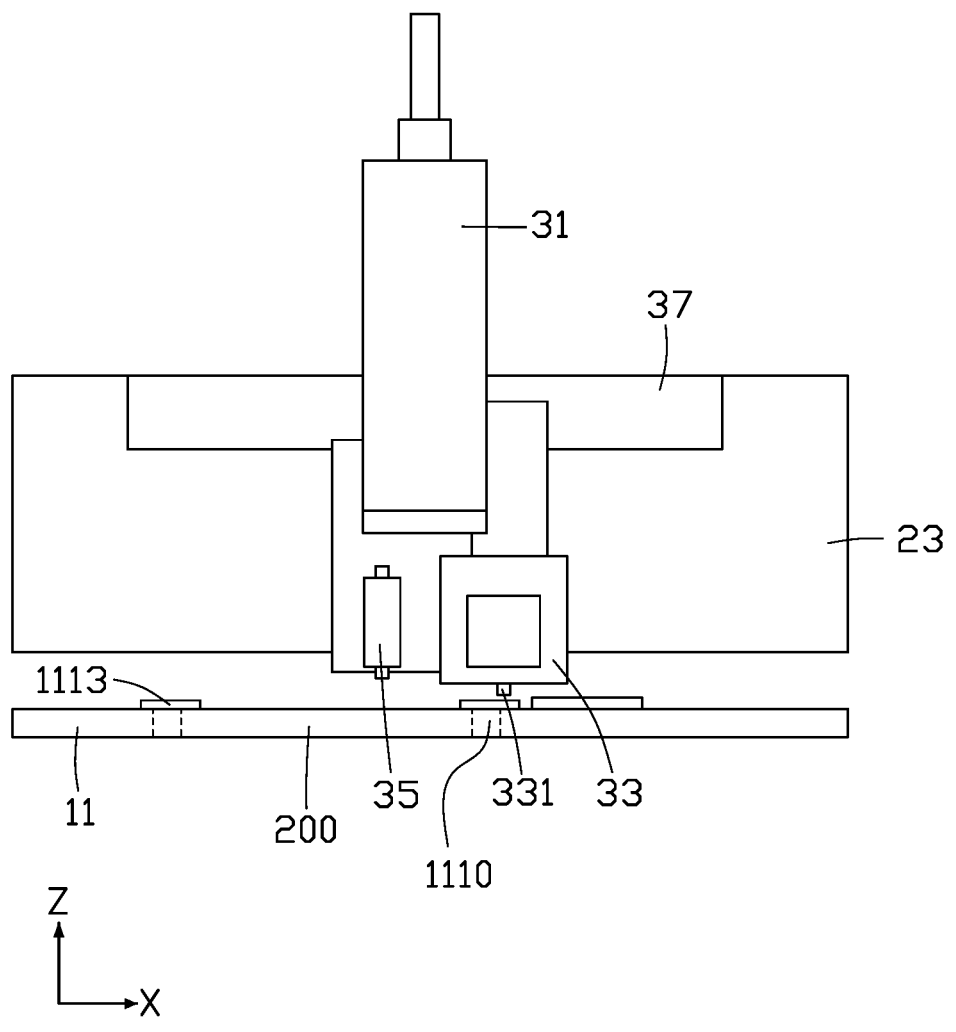
FIG. 5 is a schematic view of a retrieval section according to an embodiment of the present disclosure.

As shown in FIG. 3 and FIG. 5, the picking part 30 includes an aligning module 31 and a grabbing module 33. The aligning module 31 is used to determine a position of the LED B that needs to be removed on the display substrate A. The grabbing module 33 is used to grab and transfer the LED B. Specifically, the aligning module 31 includes an image acquisition device for obtaining distribution images of the LEDs B on the first surface A1 of the display substrate A, thereby obtaining position information of the LEDs B on the display substrate A.

The grabbing module 33 includes a suction nozzle 331 for grabbing the LED B. The suction nozzle 331 can be a vacuum suction nozzle and forms a negative pressure by vacuuming to grasp the LED B when contact with the LED B. The suction nozzle 331 can also have a groove that grasps the LED B by van der Waals force or viscosity of the material itself. An angle of the suction nozzle 331 relative to the display substrate A can be adjusted to grasp the LED B that has an angle misalignment. The adjustment of the angle of the suction nozzle 331 can be achieved by setting a rotation axis.

The grabbing module 33 can move in a third direction Z. Specifically, the suction nozzle 331 can move relative to the display substrate A in the third direction Z, so that when the captured LED B is removed from the display substrate A, it will not affect other LEDs B on the display substrate A.

The picking part 30 also includes a replenishment module 35 for supplementing binding material C onto the display substrate A. Specifically, the binding material C can be solder such as solder tin, which can melt after heating and solidify after cooling, thereby achieving binding of the LED B. The replenishment module 35 may be a solder valve that can quantitatively drip molten liquid tin onto the designated position on the display substrate A. In other embodiments, the replenishment module 35 can also be a tin needle that drips liquid tin onto a designated position on the display substrate A by dipping tin.

The picking part 30 includes a linear motor 37 to drive the grabbing module 33 and the replenishment module 35 to move in the first direction X. The grabbing module 33 needs to remove the unqualified LED B from the display substrate A and transfer the replaced LED B to the display substrate A. Therefore, by setting the linear motor 37, the grabbing module 33 transferring the LED B can be controlled. After the grabbing module 33 removing the LED B, the replenishment module 35 needs to move to the vacant position and supplement with the binding material C. By setting up a linear motor 37, it is beneficial to control movement of the grabbing module 33 and the replenishment module 35 on the same straight line, simplifying process of supplementing the binding material C.

Figure 6:
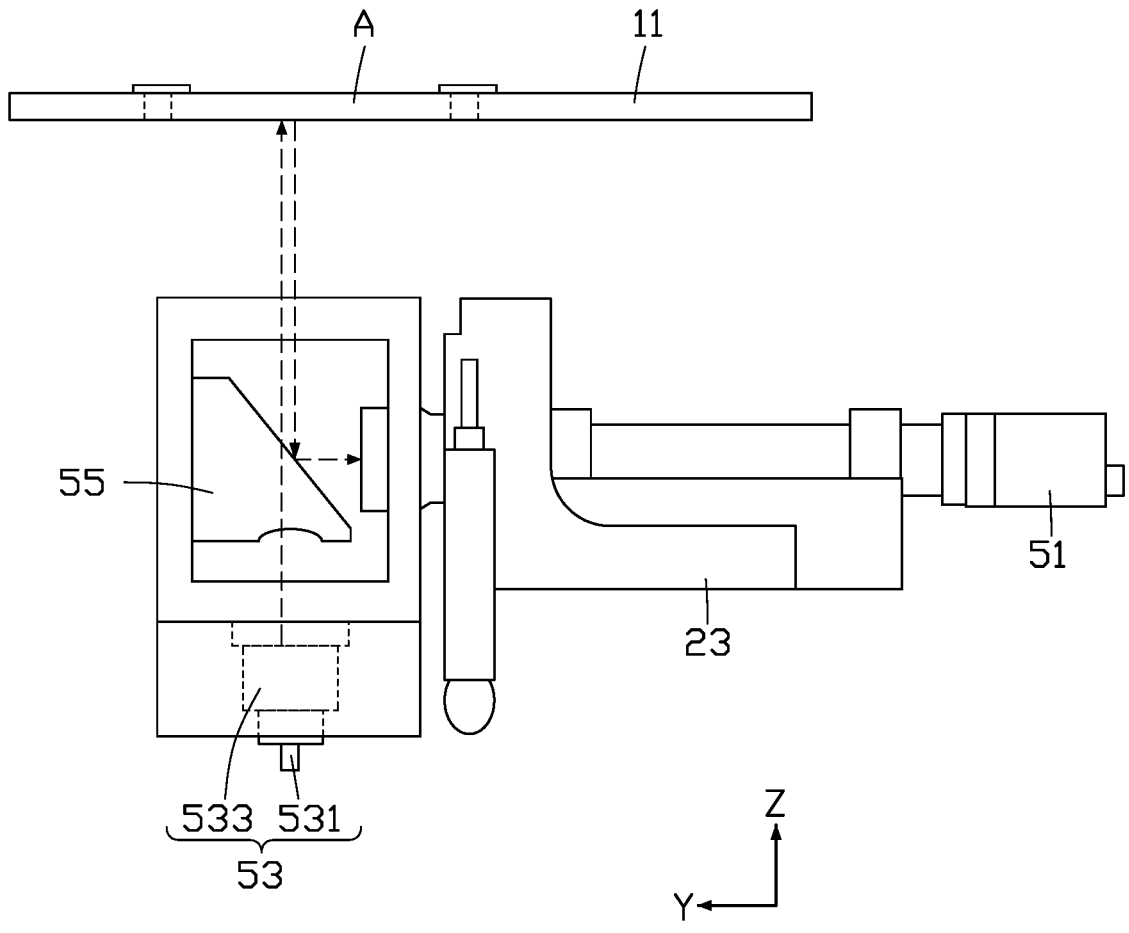
FIG. 6 is a schematic view of an unwinding part according to an embodiment of the present disclosure.

As shown in FIG. 3 and FIG. 6, the debonding part 50 includes a positioning module 51 and a heating module 53. The positioning module 51 is used to determine the position of the debonding part 50 for heating. Specifically, the positioning module 51 is an image acquisition device, and the position information of the LED B on the first surface A1 can be determined from the direction of the second surface A3 by the positioning module 51.

The positioning module 51 and the aligning module 31 are used to align at the same position on the display substrate A. Specifically, the positioning module 51 and the aligning module 31 are coaxial, and center points of the images collected by both the positioning module 51 and the aligning module 31 coincide. This means that when the positioning module 51 and the aligning module 31 simultaneously collect image information of the display panel A, the positioning module 51 and the aligning module 31 can position to a same position of the LED B.

The heating module 53 includes a laser source 531 and a focusing lens 533 for heating the display substrate A. The heating position of the heating module 53 coincides with the alignment position of the positioning module 51. Specifically, the light source 531 is a laser source used to emit laser, and the focusing lens 533 is used to focus the laser onto the display substrate A, thereby heating the display substrate A. The heating position of the heating module 53 is the alignment position of the positioning module 51, allowing the heating module 53 to accurately heat the corresponding position on the display substrate A, in order to melt the binding material C.

The debonding part 50 is also used to fix the replaced LED B. Specifically, the process of removing the LED B from the display substrate or rebinding new LED B onto the display substrate A requires heating the binding material C. When the heating temperature reaches the melting point of the binding material C, the binding material C melts. At this time, the picking part 30 can remove a LED B or place a new LED B.

The debonding part 50 also includes a semi-transparent and semi-reflective mirror 55. The semi-transparent and semi-reflective mirror 55 is arranged at a light outlet of the heating module 53, and configured for transmitting the laser emitted from the heating module 53 and reflecting light to the positioning module 51. For example, the semi-transparent and semi-reflective mirror 55 can be a 45° prism, with one right angle edge of the prism corresponding to the heating module 53, an angle between the inclined edge of the prism and the display substrate A is 45°, and an angle between the inclined edge of the prism and the positioning module 51 is 45°. In other embodiments, the semi-transparent and semi-reflective mirror 55 can also be other optical elements with semi-transparent and semi-reflective functions, and there can also be other angles between the semi-transparent and semi-reflective mirror 55 and the display substrate A and positioning module 51. The present disclosure does not limit this. This embodiment is advantageous in improving space utilization by setting the semi-transparent and semi-reflective mirror 55, which facilitates alignment of the heating module 53 and the positioning module 51 at the same position on the display substrate A.

Figure 4:
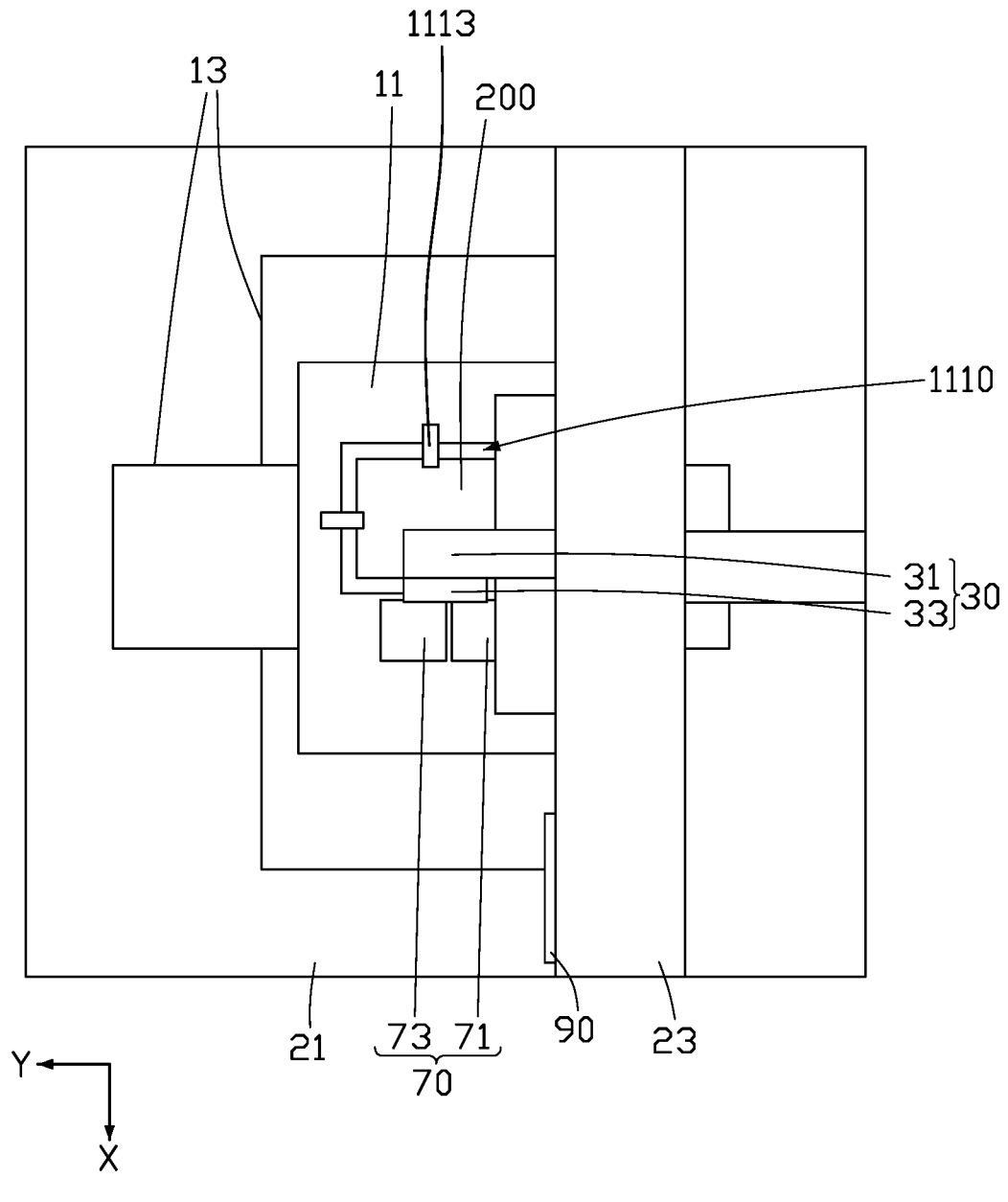
FIG. 4 is a top view of the display panel repair device.

As shown in FIG. 1 and FIG. 4, the display panel repair device 100 also includes an accommodating box 70 for providing new LEDs B and storing the removed LED B. Specifically, the accommodating box 70 can include an upper tray 71 and a lower tray 73. The upper tray 71 is used to accommodate new LEDs B, and the lower tray 73 is used to store the LED B removed from the display substrate A.

The accommodating box 70 is arranged on the bearing module 11, and the grabbing module 33 is moved between the accommodating box 70 and the display substrate A by the linear motor 37. In other embodiments, the accommodating box 70 can also be installed on the bracket 23, which is not limited in the present disclosure.

As shown in FIG. 1, the display panel repair device 100 also includes a controller 90, which is used to receive the position information of the LED B that needs to be replaced on the display substrate A, control the supporting part 10 to move the display substrate A, control the picking part 30 to replace the LED B, and control the debonding part 50 to melt the binding material C. Specifically, the controller 90 is used to control mutual cooperation between the supporting part 10, the picking part 30, and the debonding part 50, thereby achieving repairing of the display panel. The position of LED B that needs to be replaced on the display substrate A has been detected in advance, and the display panel repair device 100 only needs to replace the LED B that needs to be replaced.

The display panel repair device 100 in the present disclosure can replace the LED B while heating by setting the picking part 30 and the debonding part 50 on opposite sides of the display substrate A, which improves efficiency compared to heating and replacing on the same side of the display substrate A. Meanwhile, by heating from a side of the display substrate A away from the LEDs B, the LEDs B is avoided from being affected by the laser. By setting the aligning module 31 and the positioning module 51, it is possible to accurately locate the LED that needs to be replaced, thereby improving the accuracy of the operation. By coaxial setting the aligning module 31 and the positioning module 51, only moving the display substrate A to move the LED B that needs to be repaired to the corresponding position, the error that may occur when moving the display substrate A on both sides is avoided, and the operation accuracy is improved.

As shown in FIG. 7, the present disclosure also provides a display panel repair method, which includes following steps S1 to S3.

Step S1: the display substrate is adjusted to a predetermined position.

Step S2: an area of the display substrate corresponding to an invalid LED is heated from a side of the display substrate away from the LEDs to melt the binding material of the invalid LED, and the invalid LED is removed from display substrate.

Step S3: a new LED is bonded on the display substrate to replace the invalid LED.

In one embodiment, the display panel repair method also includes adding binding materials to the display substrate before the step S3. Specifically, after removing the LED, the remaining binding material on the display substrate may not be able to bind the new LED again, so additional binding materials are needed to fix the new LED.

The following will provide an exemplary explanation of the display panel repair method in conjunction with the display panel repair device 100 as described. The display panel repair method provided in this embodiment is not limited to this, and other suitable devices can also use this display panel repair method.

In this embodiment, the method further includes placing new LEDs B in the upper tray 71 and fixing the display panel 200 on the bearing module 11 before the step S1.

In the step S1, a plan view of the display panel 200 is sent to the controller 90. The plan view is marked with a position of the invalid LED B. The controller 90 controls the aligning module 31 to obtain image information of the display panel 200, thereby positions of the display panel 200 on the bearing module 11 corresponding to the obtained plan view. A command is sent to the driving module 13 to drive the display panel 200 to move, thereby moving the invalid LED B to a position where the aligning module 31 is aligned.

In this embodiment, before step S2, the method further includes sending instructions to the grabbing module 33 and the linear motor 37 to move the grabbing module 33 above the invalid LED B to be replaced under the driving of the linear motor 37, and driving the suction nozzle 331 to move in the third direction Z to contact the invalid LED B and grab the invalid LED B. Grasping the invalid LED B in advance helps to prevent the position of the invalid LED B from changing due to melting of the binding material C.

In Step S2, the heating module 53 is driven to heat the area of the display substrate A corresponding to the invalid LED B from the side of the display substrate A away from the LEDs B, so that the binding material C corresponding to the invalid LED B melts; the suction nozzle 331 moves in the third direction Z to remove the invalid LED B from the display substrate A after the binding material C melts; the linear motor 37 is driven to move the grabbing module 33 above the lower tray 73 and place the invalid LED B in the lower tray 73.

In this embodiment, before the step S3, the method also includes: driving the linear motor 37 to align the replenishment module 35 with a position where the invalid LED B is removed, and adding binding material C to the position where the invalid LED B is removed on the display substrate A.

In this embodiment, in the step S3, the grabbing module 33 is driven to move above the lower tray 73, and the suction nozzle 331 is driven to grab the new LED B; the grabbing module 33 is driven to move to the position where the new LED B needs to be placed on the display substrate A, and the suction nozzle 331 is controlled to move in the third direction Z, so that the new LED B is close to the display substrate A; positioning module 51 collects images of the display substrate A and confirms that the new LED B has reached a designated position; and driving the heating module 53 to heat the display substrate A, causing the added binding material C to melt, thereby binding the new LED B onto the display substrate A.

In this embodiment, after step S3, the method also includes: confirming whether there is still a valid LED B that needs to be replaced on the display substrate A, and if yes, repeating the step S1; If not, end the repair process.

The display panel repair method is beneficial for improving repair efficiency and avoiding interference of the LED on the heating module 53 during the heating process by removing the LED B and heating and melting the binding material C on different sides of the display substrate A. By providing the position of the valid LED B in advance and collecting images on display substrate A for positioning, the LED that needs to be replaced can be accurately located, thereby improving the accuracy of the operation.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A display panel repair device comprising:
   a supporting part configured to carry a display panel and control a movement of the display panel, the display panel comprising a display substrate and a plurality of light-emitting diodes (LEDs) bonded on a first surface of the display substrate by a binding material;

a picking par located on a side of the supporting part, and configured to carry the display panel, remove a LED of the plurality of LEDs from the display substrate and place a replacement-LED on the display substrate; and
   a debonding part configured to heat the display substrate from a side of the display substrate away from the picking part to melt the binding material;
   wherein the supporting part comprises a bearing module and a driving module, the bearing module comprises a bearing platform configured to fix the display substrate, the driving module is configured to move the bearing module.

2. The display panel repair device of claim 1, wherein the bearing platform defines an opening, the opening is configured for accommodating the display substrate, thereby exposing both the first surface and a second surface opposite to the first surface of the display substrate from the bearing platform.

3. The display panel repair device of claim 2, wherein a size of the opening is greater than or equal to a size of the display substrate.

4. A display panel repair device comprising:
   a supporting part configured to carry a display panel and control a movement of the display panel, the display panel comprising a display substrate and a plurality of light-emitting diodes (LEDs) bonded on a first surface of the display substrate by a binding material;
   a picking par located on a side of the supporting part, and configured to carry the display panel, remove a LED of the plurality of LEDs from the display substrate and place a replacement LED on the display substrate; and
   a debonding part configured to heat the display substrate from a side of the display substrate away from the picking part to melt the binding material, wherein the picking part comprises an aligning module and a grabbing module, the aligning module is configured to determine a position on the display substrate of the LED removed by the picking part, the grabbing module is configured to grab and transfer the LED from the display substrate and grab and transfer the replacement LED onto the display substrate.

5. The display panel repair device of claim 4, wherein the debonding part comprises a positioning module, the positioning module is configured to determine a heating position of the debonding part, the positioning module and the aligning module are configured to align at a same position on the display substrate.

6. The display panel repair device of claim 5, wherein the debonding part further comprises a heating module configured for heating the display substrate, the heating module comprises a laser source and a focusing lens, a heating position of the heating module coincides with an alignment position of the positioning module.

7. The display panel repair device of claim 5, wherein the aligning module comprises an image acquisition device for obtaining distribution images of the plurality of LEDs bonded on the first surface of the display substrate.

8. The display panel repair device of claim 5, wherein the positioning module comprises an image acquisition device configured to determine position information of the LED removed by the picking part from a side of the display substrate opposite the first surface.

9. The display panel repair device of claim 4, wherein the picking part further comprises a replenishment module for supplementing binding material onto the display substrate.

10. The display panel repair device of claim 9, wherein the picking part further comprises a linear motor to drive the grabbing module and the replenishment module to move in a first direction.

11. The display panel repair device of claim 4, wherein the grabbing module comprises a suction nozzle for grabbing the LED removed by the picking part and the replacement LED.

12. A display panel repair device comprising:

a supporting part, the supporting part configured to carry a display panel and control a movement of the display panel, the display panel comprising a display substrate and a plurality of light-emitting diodes (LEDs) bonded on a first surface of the display substrate by a binding material;

a picking part located on a side of the supporting part, and configured to carry the display panel, remove a LED of the plurality of LEDs from the display substrate and place a replacement LED on the display substrate; and a debonding part configured to heat the display substrate from a side of the display substrate away from the picking part to melt the binding material;

wherein the supporting part comprises a bearing module and a driving module, the bearing module comprises a bearing platform configured to fix the display substrate, and the driving module is configured to move the bearing module.

* * * * *